United States Patent [19]

Iafrate et al.

[11] Patent Number: 4,503,447
[45] Date of Patent: Mar. 5, 1985

[54] MULTI-DIMENSIONAL QUANTUM WELL DEVICE

[75] Inventors: Gerald J. Iafrate, Toms River; Thomas A. Aucoin, Ocean, both of N.J.; David K. Ferry, Ft. Collins, Colo.

[73] Assignee: The United States of America as represented by the Secretary of the Army, Washington, D.C.

[21] Appl. No.: 398,740

[22] Filed: Jul. 16, 1982

[51] Int. Cl.³ .................. H01L 29/161; H01L 29/78; H01L 27/12; H01L 23/48
[52] U.S. Cl. ......................................... 357/16; 357/1; 357/2; 357/3; 357/4; 357/12; 357/23.1; 357/23.15; 357/30; 357/57; 357/65; 357/68; 357/88
[58] Field of Search .................. 357/1, 2, 3, 4, 12, 357/16, 23 I, 23 R, 30, 57, 65, 68, 88, 89

[56] References Cited

U.S. PATENT DOCUMENTS

| | | | |
|---|---|---|---|
| 4,103,312 | 7/1978 | Chang et al. | 357/30 |
| 4,194,935 | 3/1980 | Dingle et al. | 357/16 |
| 4,205,329 | 5/1980 | Dingle et al. | 357/16 |
| 4,205,331 | 5/1980 | Esaki et al. | 357/3 |
| 4,257,055 | 3/1981 | Hess et al. | 357/16 |
| 4,348,611 | 9/1982 | Ruppel et al. | 357/30 |

OTHER PUBLICATIONS

W. P. Dumke et al., "Heterostructure Long Lifetime Hot Electron Transistor" *IBM Technical Disclosure Bulletin*, vol. 24 (1981) pp. 3229-3331.

*Primary Examiner*—William D. Larkins
*Assistant Examiner*—J. Carroll
*Attorney, Agent, or Firm*—Anthony T. Lane; Jeremiah G. Murray; Edward Goldberg

[57] ABSTRACT

A superlattice semiconductor device consisting of a plurality of multi-dimensional charge carrier confinement regions of semiconductor material exhibiting relatively high charge carrier mobility and a low band gap which are laterally located in a single planar layer of semiconductor material exhibiting a relatively low charge carrier mobility and high band gap and wherein the confinement regions have sizes and mutual separation substantially equal to or less than the appropriate deBroglie wavelength. The device, in its preferred form, comprises a thin film of semiconductor material selected from group II–VI or III–V compounds or silicon wherein there is formed laterally located cylindrically shaped periodic regions which are adapted to act as quantum well confinement regions for electrons.

23 Claims, 5 Drawing Figures

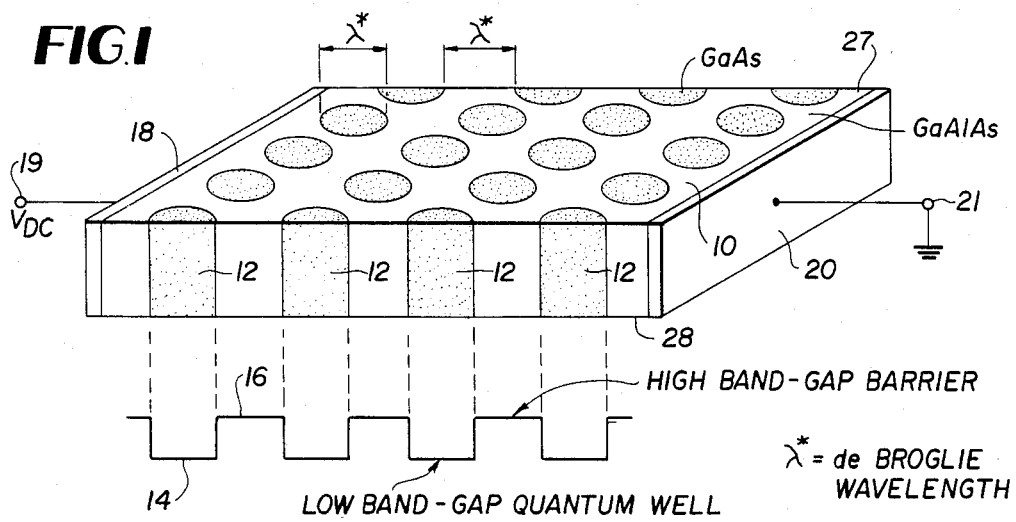
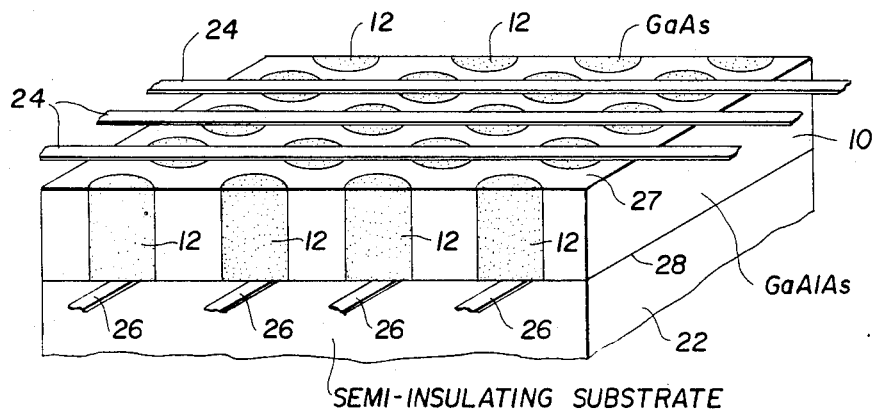
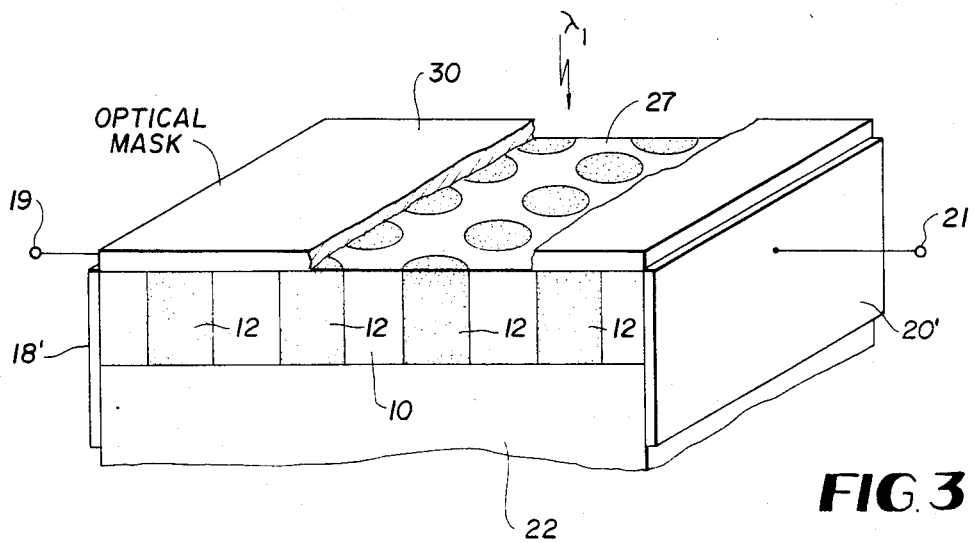

MULTI-DIMENSIONAL QUANTUM WELL DEVICE

The invention described herein may be manufactured, used and licensed by or for the Goverment for governmental purposes without the payment to us of any royalties thereon.

BACKGROUND OF THE INVENTION

This invention relates generally to semiconductor devices and more particularly to a lateral superlattice device providing quantum well transport effects.

Semiconductor devices having a superlattice structure in which there is a periodic variation in semiconductor composition is now generally known, having been shown and described, for example, in U.S. Pat. Nos. 3,626,257 and 3,626,328 which issued to Leo Esaki, et al. on Dec. 7, 1971. The layered superlattice structure disclosed therein comprises a one dimensional transport device that is formed by either doping or alloying techniques. The doping method of fabricating a superlattice structure involves epitaxially growing a semiconductor material which is periodically doped so as to produce alternating multi-thin layers having different conductivity types. A fabrication system which is particularly adapted to provide these ultra-thin, well defined multi-layered semiconductor structures comprises a process called molecular beam epitaxy (MBE) wherein automatically smooth surfaces and extremely sharp boundaries at the interface of two closely lattice matched semiconductors can be produced with a minimum number of defects. The technique of molecular beam epitaxy is well known and has been disclosed, for example, in the publication "Structures Grown By Molecular Beam Epitaxy", L. L. Chang, et al., *J. Vac. Sci. Technology*, Vol. 10, No. 5, September/October, 1973, p. 655. Another known fabrication technique involves the process of metalo-organic chemical or vapor deposition (MOCVD) which has been disclosed by N. Holonyak, in the *Journal of Applied Physics*, 1978, Vol. 49, p. 5392.

In U.S. Pat. No. 4,103,312, entitled, "Semiconductor Memory Devices", which issued to L. L. Chang, et al. on July 25, 1978, there is disclosed a multi-layered sandwich type heterostructure comprising alternating layers of different semiconductor materials forming a periodic structure and which is adapted to provide a three dimensional confinement of electrons and holes in the device.

Additionally, a multi-layered semiconductor heterostructure wherein potential wells are created between layers is disclosed in U.S. Pat. No. 4,257,055, entitled, "Negative Resistance Heterojunction Devices", which issued to K. Hess, et al. on Mar. 17, 1981. There an inner layer exhibits high charge carrier mobility and a relatively narrow band gap characteristic while the outer sandwich layers exhibit low charge carrier mobilities and a larger band gap characteristic and is operable such that under quiescent conditions the charge carriers of the outer sandwich layers reside in the inner layer due to the potential well created by the band gap difference between the layers. The application of an appropriate electrical field to the central layer, aligned with the interface between the layers, causes a very rapid transfer of electrons residing therein to the outer sandwich layers, with the resulting transfer providing a negative resistance characteristic.

It is an object of the present invention, therefore, to provide an improvement in semiconductor superlattice structures.

It is another object of the present invention to provide a two dimensional lateral superlattice structure within a single layer of semiconductor material.

Yet another object of the present invention is to provide a multi-dimensional superlattice structure in a single planar epitaxial layer of semiconductor material.

SUMMARY OF THE INVENTION

These and other objects of the invention are provided in accordance with a semiconductor device having a lateral multi-dimensional superlattice structure wherein a plurality of charge carrier confinement regions consisting of semiconductor material exhibiting relatively high charge carrier mobility and a low band gap are located in discrete regions of a single planar layer of semiconductor material exhibiting a relatively low charge carrier mobility and high band gap and wherein the confinement regions have sizes and mutual separations substantially equal to or less than the appropriate deBroglie wavelength. In its preferred form, the device comprises a thin film of gallium aluminum arsenide (GaAlAs) having ultra-small cylindrically shaped periodic regions of gallium arsenide (GaAs) located therein which act as quantum well confinement regions for charge carriers such as electrons.

BRIEF DESCRIPTION OF THE DRAWINGS

FIG. 1 is a perspective view of a lateral superlattice structure in accordance with the subject invention;

FIG. 2 is a perspective view illustrative of a high density memory utilizing the lateral superlattice structure of FIG. 1;

FIG. 3 is a perspective view of a replication device utilizing the lateral superlattice structure of FIG. 1;

DESCRIPTION OF THE PREFERRED EMBODIMENTS

Figure 4:
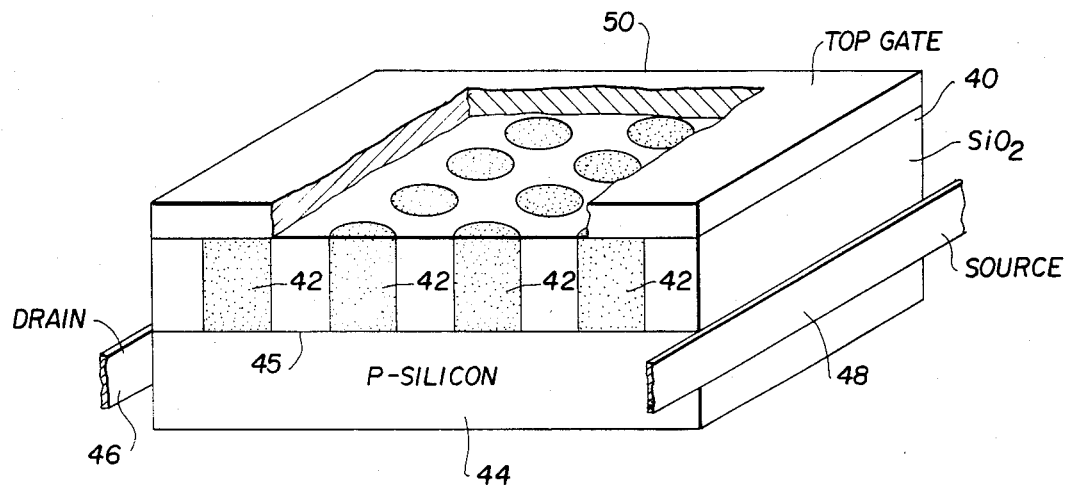
FIG. 4 is a perspective view of a lateral superlattice field effect transistor in accordance with the subject invention.

Referring now to the drawings and more particularly to FIG. 1, disclosed therein is a two dimensional lateral superlattice structure formed in the surface of a thin planar layer 10 of gallium aluminum arsenide ($Ga_x Al_{1-x} As$ where $1 \leq x \geq 0$) in which there is formed a plurality of cylindrically shaped periodic regions of gallium arsenide (GaAs) 12. These periodic regions 12 comprise active cells or wells which are formed, for example, by having holes physically etched in the GaAlAs layer 10 by means of a technique of high resolution lithography wherein a hole pattern is first established, followed by selected anisotropic etching and selective area epitaxial growth. The resultant configuration comprises a two dimensional array of low band gap quantum wells separated by a relatively high band gap barrier. This is illustrated by the line segments 14 and 16 of the energy band pattern shown associated with the structure of FIG. 1. Moreover, the diameter of the active cells 12 and their mutual separation is made to be of the order of the deBroglie wavelength for a charge carrier where the deBroglie wavelength $\lambda^*$ is defined by the expression:

$$\lambda^* = h/m^* v_t$$

where h is Planck's constant, $m^*$ is the effective mass of the charge carrier, and $v_t$ is the drift velocity of the charge carrier. For GaAs the cylinder size and periodic spacing must lie in the order of 250 Å or less.

Assuming for purposes of explanation that the charge carriers are comprised of electrons, the active cells 12 act as quantum wells for electrons due to the energy band gap difference and the mutual separation between the cells 12 in the GaAlAs layer 10. The application of an appropriate electrical field, applied, for example, by means of a DC potential $V_{DC}$ applied across opposing pairs of contact surfaces 18 and 20 by means of terminals 19 and 21 causes a very rapid transfer of the electrons residing in the cells to adjoining cells in the direction of the applied electrical field.

For an isolated cylinder cell 12, the number of electron states available for electron occupation will depend upon the diameter of the cylinder and the energy depth of the well which is determined by the x value of the $Ga_xAl_{1-x}As$ material surrounding 12. For a cylindrical diameter on the order of 250Å and an x value of 0, a well depth of about 0.8 electron volts (eV) will occur with two energy states available with an energy level spacing of approximately 0.1 eV. It should be pointed out that 0.125 eV corresponds to approximately $3 \times 10^{13}$ Hz. Where the array of periodic cylinders is constructed so that the cylinder spacing is close enough so that there is appreciable cylinder wave function overlap, then the low lying energy levels are in the form of two dimensional "superlattice" bands of which the energy levels spacing is of the order of 1 milli-electron volt (meV) to 0.1 meV, where 1.25 meV, for example, corresponds to $3 \times 10^{11}$ Hz or 300 GHz and 0.125 meV corresponds to $3 \times 10^{10}$ Hz or 30 GHz.

Accordingly, the number of electron states in the cell is determined by the geometry of the cell and the spacing therebetween. While the configuration shown in FIG. 1 comprises a regular periodic spacing, they can, when desired, be arranged in clusters. While the two dimensional superlattice structure of FIG. 1 is shown comprised of GaAs and GaAlAs, other semiconductor materials can be utilized when desirable when selectively chosen from groups II-VI or III-V compounds or silicon. However, the size of the confinement regions or active cells 12 and their mutual separations will normally lie in a range between 50 Å and 500 Å for lateral and two dimensional transport of charge carriers.

The two dimensional superlattice configuration as shown in FIG. 1 is adapted to manifest significant transport properties and accordingly lends itself to several important applications such as a high density memory and a source of relatively high power millimeter wave coherent emission. The structure of the subject invention, moreover, also gives rise to a strong negative mass-effect above a certain threshold electric field which thereby leads to a strong negative differential resistance in such structures. This opens up the possibility of high speed negative differential resistance devices and Gunn-type oscillators. In addition, such structures can be tailored to switch from a non-conducting to conducting state due to the resonant transfer of charge when the difference in potential between two adjacent wells corresponds to the occupied level of one well and the upper unoccupied level of an adjacent well.

With respect to memory applications, reference is now made to FIG. 2 wherein a configuration having a quantum well density in the order of $10^{10}$ per square cm. can be realized, giving rise to a very dense one or two electron charge coupled device. As shown in FIG. 2, a two dimensional periodic arrangement of GaAs active cells 12 are formed in a layer of GaAlAs 10 with the structure moreover being fabricated on a semi-insulating substrate 22. With the cells being arranged in an orderly manner, i.e. rows and columns, a plurality of rows and columns of ultra thin degenerately doped semiconductor strips 24 and 26, respectively, are put down on the upper and lower surfaces 27 and 28 of the GaAlAs layer 10 such that they span the active cells in mutually orthogonal directions. Thus by applying an electrical potential to an ith strip on top of the layer 10 and jth strip on the bottom of the layer 10, one can electrically address the active cell or cylinder in the ith row and the jth column of the array. With such an electrical arrangement, charge can be made to exit a cylindrical cell 12 from above or below and travel through the layer 10 to another cylinder which is suitably biased, by means not shown, to accept charge. Although the dimensions involved in fabricating the two sets of metal strips 24 and 26 are ultra small, present day technology is at hand to accomplish the task. When desirable, a high density memory storage for a device such as described with respect to FIG. 2 can be controlled by optical or e-beam addressing rather than mutually orthogonal address strips 24 and 26.

With respect to optical properties of a device such as shown in FIG. 1, depending upon the configuration and feature size of the array, energy level spacings can be tailored to be in the spectroscopic range covering infra red (0.1 eV) to millimeter wave (approximately 1 meV) frequencies. Although such frequencies are also realizable in conventional one dimensional superlattice structures, transitions between the energy levels of one dimensional superlattices are weak because the superlattice energy spacing is smeared due to the continuium of states available in the directions perpendicular to the one dimensionality. In the structural configuration disclosed in FIG. 1, however, electrons are truly confined in all dimensions, thus giving rise to strong emission between superlattice bands. Radiation can be emitted from such a structure by either exposing the array to radiation with frequency above the GaAs band gap or by injecting charge into the upper state of the quantum well through the contacts 18 and 20 placed on the sides of the structure. In addition, population inversion and resonant charge transfer is accomplished by applying a uniform electric field across the device and adjusting the field by the magnitude of potential $V_{DC}$ so that the difference in potential between two closely spaced adjacent wells 12 correspond to the occupied level of one well and the upper unoccupied level of the adjacent well. In this way a single injected electron, in traversing the array from one side to another, can emit radiation many times by tunneling, at constant energy, between adjacent wells 12. In each tunneling step, an electron falls to a new energy level, giving rise to emitted radiation.

It should be noted that temperature considerations lead to a thermal broadening of energy lines. If, however, the thermal energy (kT) of the carrier (electron) is less than the energy level separation at any given well, then thermalization for all practical purposes will have a secondary effect upon the spectroscopic behavior of the system. This is reflected in the following Table I.

TABLE I

| T(°K.) | kT(meV)* | f(GHz) | hf = ΔE(meV)* |
|---|---|---|---|
| 1 | 0.01 | 30,000 | 125 |
| 77 | 6.65 | 300 | 1.25 |
| 300 | 25.89 | 30 | 0.125 |

*meV = milli - electron volts.

It is evident from Table I that for emission in the 30 GHz region (hf=0.125 meV) the device should be operated at a temperature in the vicinity of 300° K. For emission in the 300 GHz region (hf=1.25 meV), the device should operate at about 77° K. while for operation in the 30,000 GHz region (hf=125 meV), the device should be operated at 1° K.

Referring now to FIG. 3, there is shown a structure in accordance with the subject invention which can be utilized in replication applications. There an optical mask 30 of a desired pattern, not shown, is placed on the upper surface 27 of a two dimensional superlattice structure as shown in FIG. 1. It is also shown being formed on a semi-insulating structure 22 and having enlarged electrodes 18' and 20' applied to opposing side walls. When radiation of a wavelength $\lambda_1$, a frequency which is substantially above the GaAs gap frequency exposes the mask 30, then electrons are excited to the conduction band confinement regions of the cells 12. If recombination is suitably suppressed by charge injection into the valance band by the application of an electric field by means of a voltage applied across terminals 19 and 21, then excited electrons will diffuse into unoccupied wells by means of tunneling through the substrate 22. The transfer process being highly non-linear gives rise to a non-linear diffusion. Such a non-linear diffusion process, however, permits the information or pattern being diffused to maintain a coherence or memory so that after a given time or duty cycle has elapsed, the pattern replicates itself with a well defined multiplicity, i.e. the original pattern is replicated many times over, but with smaller dimensions than previously prepared. This pattern can be read electrically or by use of a luminescent display technique, not shown, but well known to those skilled in the art.

Referring now to FIG. 4, the structure depicted there comprises a metal oxide semiconductor field effect transistor (MOSFET) and is similar to the GaAlAs-GaAs embodiments considered above. However, it should be noted that the structure is now comprised of a silicon dioxide ($SiO_2$) layer 40 having a pattern of cylindrical cavities lithographically written and etched in a two dimensional periodic arrangement or matrix which is back filled with insulator material having a dielectric constant other than $SiO_2$ thereby providing a periodic arrangement of rows and columns of cylindrical wells 42. When desirable, even intrinsic silicon can be used. The structure, moreover, is formed on a p-type silicon substrate 44. Drain and source electrodes 46 and 48 are applied along opposite sides of the substrate 44 adjacent the interface 45 between the silicon dioxide layer 40 and the silicon substrate 44. Additionally, a blanket top gate layer 50 of silicon, for example, is applied across the surface of the silicon dioxide matrix 40 to provide gap potential control. The surface potential will follow the periodicity of the array when the semiconductor is driven into inversion. This is true because the electric field discontinuity suffered across the oxide-insulator interface will be different in the oxide and in the substituuted insulating region. Thus the number of electrons which dictate the surface potential will vary in accordance with the electrical field variation at the interface. As a result, such a device will manifest very strong negative differential resistance behavior due to the presence of the lateral two dimensional induced superlattice at the interface.

Figure 5:
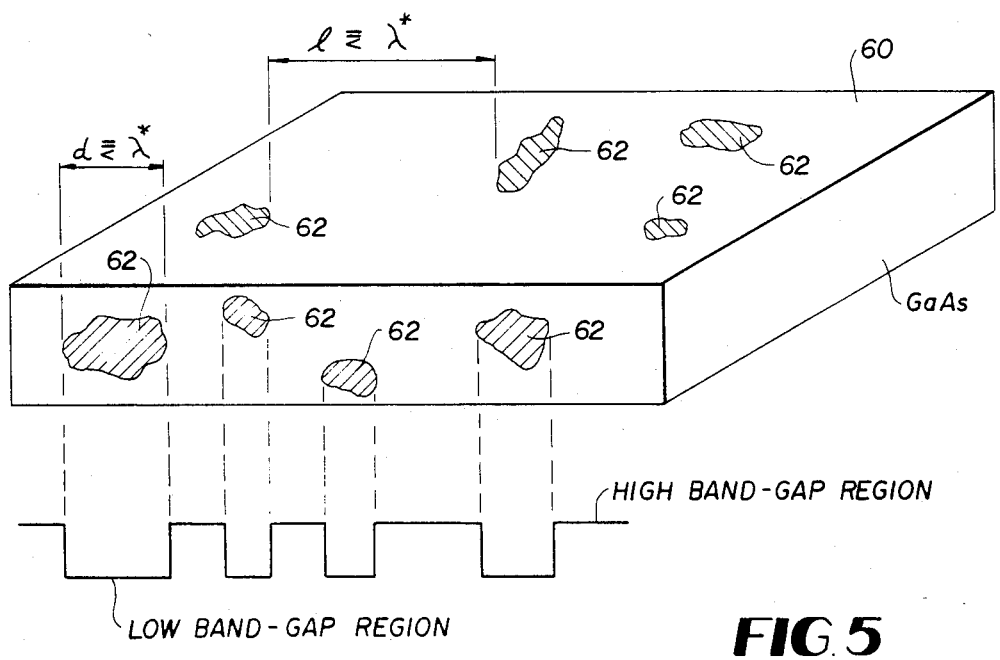
FIG. 5 is a perspective view of a three dimensional amorphous superlattice structure in accordance with the subject invention.

While the invention in its preferred form is comprised of a structure having a plurality of periodic charge confinement regions in two dimensions located laterally across a single planar layer, an amorphous quantum well array is disclosed in the structure of FIG. 5. Referring to FIG. 5, a high band gap layer 60 of GaAs has a plurality of low band gap germanium (Ge) granules 62 embedded therein. This embodiment lacks the periodicity of confinement regions, but nevertheless the confinement regions, while being randomly distributed, have certain constrains, namely that the average size and mutual separation between granules 62 are equal to or less than the deBroglie wavelenth $\lambda^*$, a range between 50 Å and 500 Å. Despite the random distribution the essential physical transport and optical phenomenon described with respect to the foregoing embodiments will manifest itself in this structure apart from an anticipated optical broadening due to the amorphous nature of the device. The desirability of the structure such as shown in FIG. 5 rests in the fact that it is relatively easy to fabricate by known sputtering techniques.

Thus what has been shown and described in a semiconductor device having a plurality of multi-dimensional charge carrier confinement regions or quantum wells located in a single layer of semiconductor material.

Having thus shown and described what is at present considered to be the preferred embodiments of the invention, it should be noted that the foregoing has been made by way of illustration and not limitation and accordingly all modifications, alternations and changes coming within the spirit and scope of the invention as set forth in the appended claims is herein meant to be included.

We claim:
1. A semiconductor device formed from first and second type of semiconductive material exhibiting predetermined energy gaps between their conductive and valance bands and wherein said first type of semiconductive material further exhibits a relatively low charge carrier mobility at high band gap and wherein said second type of semiconductive material exhibits relatively high charge carrier mobility at low band gap and comprising, a thin uniform planar layer of said first type of semiconductive material having opposite ends, a plurality of multi-dimensional charge carrier confinement regions of said second type of semiconductive material laterally disposed within said layer of said first type semiconductive material and wherein said confinement regions have respective sizes and mutual separations between adjacent regions substantially equal to or less than the de Broglie wavelength $\lambda^*$ of the charge carrier and which is defined by the expression:

$$\lambda^* = h/m^* v_t$$

where h is Planck's constant, $m^*$ is the effective mass of the charge carrier, and $v_t$ is the drift velocity of the charge carrier, and means applying potential across the opposite ends of said layer of said first type of semiconductive material causing rapid charge carrier transfer between said confinement regions in the direction of applied potential.

2. The semiconductor device as defined by claim 1 wherein said first and second types of semiconductor material are selected from group III-V semiconductive materials.

3. The semiconductor device as defined by claim 1 wherein said first and second types of semiconductor material are selecfted from group II-VI semiconductor materials.

4. The semiconductor device as defined by claim 1 wherein said confinement regions are periodically located in said layer of first type semiconductor material.

5. The semiconductor device as defined by claim 4 wherein said confinement regions are arranged in a two dimensional pattern in said layer.

6. A semiconductor device as defined by claim 5 wherein said confinement regions comprise wells for confining electrons.

7. The semiconductor device as defined by claim 6 wherein said electron confinement wells are generally cylindircally shaped and spaced laterally within said layer between said ends.

8. The semiconductor device as defined by claim 7 wherein said layer of first type of semiconductor material is comprised of a relatively thin generally uniform layer of $Ga_xAl_{1-x}As$ and said electron confinement wells are comprised of GaAs.

9. A semiconductor device as defined by claim 8 wherein said generally cylindrically shaped wells have a cylinder diameter substantially 250 Å or less.

10. The semiconductor device as defined by claim 9 wherein the mutual separation of said electron confinement wells is substantially 250 Å or less.

11. The semiconductor device as defined in claim 1 wherein said confinement regions are periodically located in a generally rectangular matrix having a mutual separation ranging between 50 Å and 500 Å.

12. The semiconductor device as defined by claim 11 wherein said confinement regions are of a generally uniform shape having an average size ranging between 50 Å and 500 Å.

13. The semiconductor device as defined by claim 12 wherein said confinement regions are comprised of electron confinement regions that are generally cylindrically shaped and spaced laterally within said layer between said ends.

14. The device as defined by claim 13 wherein said generally cylindrical confinement regions have a depth substantially equal to the thickness of said layer of first type semiconductor material.

15. The device as defined by claim 1 wherein said layer of first type semiconductor material is comprised of a relatively thin and generally uniform layer of $Ga_xAl_{1-x}As$ and said electron confinement regions are comprised of GaAs.

16. The device as defined by claim 1 and additionally including a semi-insulating substrate and wherein said layer of first type semiconductor material comprises an epitaxial layer formed on said substrate.

17. The device as defined by claim 1 wherein said confinement regions are arranged in rows and columns and additionally including a first plurality of parallel narrow contact strips spanning respective rows of said confinement regions on one side of said layer of first type semiconductor material and a second plurality of parallel narrow contact strips spanning respective columns of said electron confinement regions on the opposite side of said layer of said first type of semiconductor material whereby each individual confinement region can be addressed by selective coupling to said contact strips.

18. The device as defined by claim 1 and additionally including a substrate of silicon doped with a predetermined dopant material and wherein said layer of first type semiconductor material comprises an oxide of silicon layer formed on said substrate and said charge carrier confinement regions are comprised of regions of insulator material having a dielectric constant different than said oxide of silicon.

19. The device as defined by claim 18 and additionally including drain and source electrodes at opposite ends of said substrate, and gate contact means on said layer over said confinement regions to provide a transistor.

20. The device as defined by claim 19 wherein said substrate is comprised of p-type silicon and said layer of first type semiconductor material comprises a layer of silicon dioxide.

21. The device as defined by claim 1 wherein said confinement regions are randomly distributed in said layer of said first type semiconductor material and having a size ranging between 50 Å and 200 Å and wherein the separation between adjacent confinement regions ranges between 50 Å and 500 Å.

22. The device as defined by claim 21 wherein said confinement regions are comprised of granules of germanium located in a layer of gallium arsenide.

23. The device as defined by claim 16 including an optical mask on said layer over said confinement regions.

* * * * *